United States Patent
Björsne et al.

(10) Patent No.: US 7,181,648 B2
(45) Date of Patent: Feb. 20, 2007

(54) METHOD TO ASSIST IDENTIFICATION OF A DEFECTIVE FUNCTIONAL UNIT IN A TECHNICAL SYSTEM

(75) Inventors: Tord Björsne, Dietenhofen (DE); Holger Dresel, Altendorf (DE)

(73) Assignee: Siemens Aktiengesellschaft, Munich (DE)

( * ) Notice: Subject to any disclaimer, the term of this patent is extended or adjusted under 35 U.S.C. 154(b) by 442 days.

(21) Appl. No.: 10/663,068

(22) Filed: Sep. 16, 2003

(65) Prior Publication Data
US 2004/0153819 A1  Aug. 5, 2004

(30) Foreign Application Priority Data
Sep. 23, 2002  (DE) ................ 102 44 131

(51) Int. Cl.
*G06F 11/00* (2006.01)
(52) U.S. Cl. .................................. 714/26; 714/25
(58) Field of Classification Search .............. 714/25, 714/26, 30, 31, 40
See application file for complete search history.

(56) References Cited
U.S. PATENT DOCUMENTS

| | | | | |
|---|---|---|---|---|
| 3,928,830 A | * | 12/1975 | Bellamy et al. | 714/57 |
| 6,029,258 A | * | 2/2000 | Ahmad | 714/46 |
| 6,175,934 B1 | * | 1/2001 | Hershey et al. | 714/25 |
| 6,304,982 B1 | * | 10/2001 | Mongan et al. | 714/38 |
| 6,691,249 B1 | * | 2/2004 | Barford et al. | 714/25 |
| 7,096,387 B2 | * | 8/2006 | Durrant et al. | 714/31 |

FOREIGN PATENT DOCUMENTS

| | | |
|---|---|---|
| DE | 198 03 032 | 7/1999 |
| DE | 199 17 102 | 7/2002 |

* cited by examiner

*Primary Examiner*—Scott Baderman
*Assistant Examiner*—Joshua Lohn
(74) *Attorney, Agent, or Firm*—Schiff Hardin LLP (57) ABSTRACT

In a method to assist in the identification of a defective functional unit in a technical system that includes a number of functional units, a first test is implemented on the technical system for identification, the first tests implementing a measurement on the technical system and providing a first test result. Using a test model in which information is compiled about which functional units were tested, and using a system model in which information is compiled about the assembly of the technical system, an automated processing of the first test results is implemented. The first test result is analyzed in order to determine a group of functional units that may be defective, and using the analysis of the functional units of the group, defect probabilities are assigned.

23 Claims, 6 Drawing Sheets

METHOD TO ASSIST IDENTIFICATION OF A DEFECTIVE FUNCTIONAL UNIT IN A TECHNICAL SYSTEM

BACKGROUND OF THE INVENTION

1. Field of the Invention

The present invention concerns a method to assist in the identification of a defective functional unit in a technical system.

2. Description of the Prior Art

The identification of a defective functional unit in a technical system is a requirement for a quick and successful repair. Given proper identification, only the defective functional unit is exchanged with an intact replacement functional unit. An accelerated repair leads to shorter down time and this increases the value of the technical system.

The high complexity of technical systems that are assembled from many independent functional units hampers the identification and necessitates a number of tests that effect multiple measurements on the technical systems. The choice of the correct tests, their combination, and their evaluation is incumbent on a service technician to whom assisting information is available, for example handbooks, circuit diagrams, or information about the tests. Since the supporting information and the tests are updated on an ongoing basis, and the versions of the technical systems are modified, the service technician can easily lag behind in his or her level of information, such that the service technician can only identify the defective functional unit by testing. Each unnecessary exchange of a non-defective functional unit leads to additional costs.

A method for computer-aided optimization of test specifications with a minimization of test software, as well for proof of the verifiability of the technical devices, equipment or systems to be developed, is known from German OS 198 03 032. First, a product model corresponding to the technical design is generated and entered, the components specified by the model being functional blocks or the smallest and largest exchangeable units, connections between the functional blocks shown by test paths, and diagnosis test points to be provided between or at the functional blocks. In a next step, an adaptive adjustment of the functional levels of the product model is undertaken, dependent on conclusions of verifiability achieved with the preceding model step. For this the test paths are simulated by a computer and the test reports received are evaluated by test logic. The optimized, completely verifiable product model achieved in this manner, in a number of steps as needed is stored in a technical databank. A programmed connection to standardized test software can be created via the respective test path names.

Known from German PS 199 17 102 is a project planning and diagnosis device for an electrical device made from electrical devices/stations in a modular assembly to control and/or monitor technical processes and/or for industrial automation and/or building automation with the use of a computer system that has an interface to the electrical system.

SUMMARY OF THE INVENTION

An object of the present invention is to enable a faster and more precise identification of a defective functional unit in a technical system.

This object is inventively achieved in a method to support identification of a defective functional unit in a technical system that has a number of functional units, wherein a first test is conducted at the technical system for defect identification, the first test implementing a measurement at the technical system and providing a first test result, and wherein an automatic processing of the first test result is implemented using a test model in which information is summarized about which functional units were tested and (using a system model in which information is summarized) about assembly of the technical system. The first test result is analyzed in order to determine a group of functional units that may be defective, and defect probabilities are assigned using the analysis of the functional units of the group.

An advantage of the method is that the information in the system model about the assembly of the technical system is associated with a first test that is implemented at the technical system. It is thereby possible for information to be consulted about which functional units were tested by the first text. This then allows the automatic processing of the first test result, in which a group of functional units are selected from all of the functional units that form the technical system.

The group of functional units contains at least one of its functional units is defective. The allocation of functional units should be clarified, dependent on the test results, using two extreme cases. In the first case example, in which the test shows that one of the tested functional units is defective, the group is comprised of functional units tested by the test. In the second case example, the test does not show a defect of the tested functional units, and the tested functional units are not assigned to the group.

A further advantage of the method is that information with regard to the technical system is used in order to assign defect probabilities to the functional units of the group that arise from the participation in the first test. Additional information of the test model can enter into the probability assignment, for example the susceptibility of a functional unit to defects. A more precise defect probability can be assigned in this manner.

In an embodiment of the method, the defect probabilities of the functional units in the group are compared with a defect probability limit, the defect probability limit being defined such that for each defect probability that is larger than the defect probability limit, the appertaining functional unit is classified as defective. This has the advantage that a defective functional unit can be identified with an automatic analysis and assignment of defect probabilities.

In an embodiment of the method that for the case of no defect probability lying above the defect probability limit, at least one second test is suggested using the defect probability limit. This test further refines more defect probabilities. For example, this can be achieved by only one subgroup of the group of functional units is tested. An advantage of the method is that, with the use of the defect probabilities, with the knowledge about the assembly of the technical system, and with the knowledge about which functional units were addressed by which test, tests can subsequently be automatically evaluated, to the extent that implementation enables it, to more precisely the refine defect probabilities of the functional units of the group.

In a further embodiment of the method, the test suggestions are arranged according to at least one criterion that evaluates the relevance of the test suggestion with regard to identification of the defective unit. It is advantageous, for example, to incorporate the expenditure of time that the test requires to run, or an evaluation could subsequently ensue as to how closely the functional units participating in the test agree with the functional units for which a specific more precise rendering of the defect probability is available.

In another embodiment, the most relevant of the suggested tests is automatically implemented. This has the advantage that a sequence of tests can be implemented independent of influence by a service technician.

In a preferred embodiment, one of the test suggestions is implemented as a second test. By consideration of the first test results, and with inclusion of information about which functional units corresponding to the test model were tested, which assembly of the technical system confirms to the system model, and which results included at least one earlier test, the test result of the second test is then analyzed in order to further render more precisely the defect probabilities of the functional units of the group. Furthermore, in the case that a more precisely rendered defect probability of a functional unit lies over the aforementioned limit, this functional unit is identified as defective, or, in the case that no defect probability lies over the limit, at least one further test is suggested to render more precisely the defect probabilities of the functional units of the group. In addition, these test suggestions are automatically arranged according to at least one criterion that evaluates the relevance of the test suggestion with regard to the identification of the defective unit.

In an embodiment of the method, a newly suggested test is implemented until a functional unit lies above the limit, and this functional unit is identified as a defective functional unit. An advantage of this embodiment is that a containment of the group of functional units that may be defective is possible due to the repeated implementation of the automatic processing of test results, and the containment can be continued without participation by a service technician until the defective functional unit is identified. The margin of error of this method can be minimized by selection of the limit defect probability.

In a particular embodiment, the defect probability of a functional unit according to the implementation of a test arises from a mathematical combination of the defect probability before the test with the defect probability based on the test. This has the advantage that already-acquired information can be specifically incorporated in the defect probability of a functional unit.

In an embodiment of the method, the functional units from which the technical system is assembled are replaceable constructional units and replaceable connection units between further functional units. These connection units can transmit signals between the functional units, for example electrical or optical signals. Furthermore, they can transmit signals via pneumatic or hydraulic means, or they can enable an energy supply of a functional unit. The structuring of the assembly of the technical system in functional units that are FRUs (field replaceable units) that can be replaced as a whole has the advantage that, after the identification of the defective functional unit, the repair of the technical system can be implemented quickly by exchange of the functional unit.

In a further embodiment of the method, one test checks the function of an individual functional unit. In another embodiment, one test checks a number of functional units along a test signal path. These embodiments have the advantage that an individual functional unit can be checked, and the combined effect of a number of functional units can be checked.

In a further embodiment, different tests can be generated from a test program by means of parameterization. This has the advantage that a test program can be designed in a generic form that can then be used, for example, to check different structures that are similar in terms of their construction. A further advantage is that a test program can be written that can run on different technical systems of a system family, by the corresponding parameters of the respective technical system being transferred to the test program.

In another embodiment, a number of tests (with, for example, a common function) form a test block and can thus be executed, to simplify the ability for implementation, with a single call of the test block. This has the advantage that tests that serve, for example, to check a module of the technical system can be specifically called in order to more closely determine the defect probabilities of the functional units of this module. A further advantage is that a service technician does not have to individually call many different tests.

In another embodiment, it is summarized in the test model which functional units are checked by which test or test block. The test model is, for example, generated by configuring a test program model on the technical system. The test program model specifies, for example, the tests or test blocks that can be implemented on the technical system or on systems that are similar to this technical system. The specification of the tests or test blocks can include their purpose, which preparations and post-processings are necessary at the technical system for a test, whether the test can be automatically implemented or whether participation by a service technician is necessary, further important parameters, and naturally the functional units respectively involved in a test. An important parameter is, for example, the duration of the execution of the test.

Such a test program model can arise from a super test program model, and has the advantage that a programming of the automatic processing of test results is possible that can be applied to an entire system family of technical systems. Furthermore, the test program model can represent the dependency of the operability of the functional units on a test result, or include rules for finding errors in a common form or in a form specific to a technical system that were acquired from the knowledge of experienced service technicians, system designers, and engineers. The automatic processing then uses a type of expert system.

An advantage of the realization of the method with such a test model is the possibility to automate the defect identification. Such an automation then enables it to assemble the test model independent of test blocks, such that tests can specifically be called from the method that also lead to a more precise rendering of the defect probabilities. This is possible by the availability of the relevant information in the test model and by the automated processing. The defect identification can be significantly accelerated in this manner, since the tests of a test block, whether advantageous or not, need not all be implemented.

In a further embodiment the system model is based on the functional units. The system model can be generated, for example, by configuring a super system model on the technical system. The super system model includes all related technical systems that, for example, belong to a system family. The advantage of such a system model is that it allows the interpretation of a test or test block with regard to the assembly of the technical system, und thus makes accessible the functional units that are addressed by a test or test block. The system model knows, for example, which functional units (FRUs) are present in the technical system and how they are connected with one another via the connection units (cables). Furthermore, the system model can include a statistical model about the reliability of the functional units.

The automated assistance of an identification of a defective functional unit according to the method of the invention is realized, for example, by the technical system being structured in functional units in the form of a system model, and by the interaction of a test with the technical system being specified in a test model. The test model includes, for example, the object, the effective loop, the expected time, and other parameters that represent the technical system. The configuration of system model and test model can automatically ensue corresponding to the respective technical system, with the execution of the method being programmed independent of the technical system.

An additional advantage of the method is the possibility to integrate the method into test software that mirrors system families and a number of tests in a concise structure. The test software that is adapted to the invention enables a simple actualization with regards to changes in the systems and in the tests.

DESCRIPTION OF THE PREFERRED EMBODIMENTS

Figure 1:
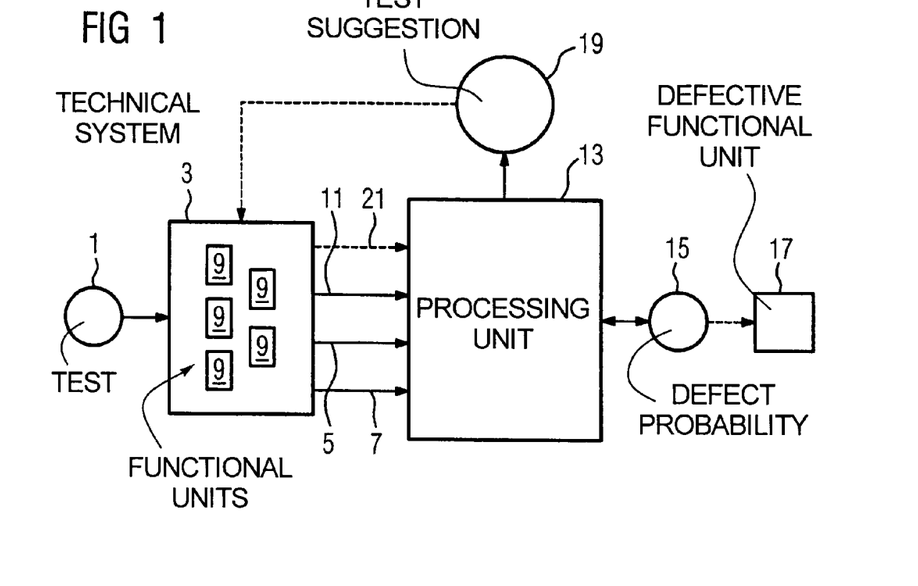
FIG. 1 is a flow diagram to explain the inventive method to aid identification of a defective functional unit in a technical system.

FIG. 1 shows a flow diagram that explains the method for assisting an identification of a defective functional unit. A test 1 is implemented at a technical system 3 and provides a first test result 5. The first test result 5 is supplied to a processing unit 13 for automated processing of test results 5, together with the information 7 as to which functional units 9 of the technical system 3 were tested, and with the information 11 about the assembly of the technical system 3.

The test results are analyzed in the processing unit 13, and a group of functional units 9 that could be defective based on the test 1 is compiled under incorporation of the supplied information. In the event that the test indicates no defect, the group of functional units 9 is comprised of the not-tested functional units 9, for example according to the exclusion principle. In the event that the test indicates a defect, the group preferably includes functional units 9 that participated in the test.

Additionally, a defect probability 15 is associated in the analysis to each functional unit 9 of the group. The defect probabilities 15 of the functional units 9 are compared to a limit defect probability limit, and as soon as a defect probability 15 of a functional unit 9 is greater than this defect probability limit, the functional unit 9 corresponding thereto is identified as the defective functional unit 17. If no defect probability 15 exceeds the defect probability limit, at least one test suggestion 19 is determined by the processing unit 13. The test suggestion 19 is selected such that, by means of its implementation, the group of functional units 9 can be further narrowed, or that by means of its implementation the defect probabilities 15 of the functional units 9 of the group can be made more precise. The processing unit 13 stores the signal processing 15 of the functional unit 9 so as to compare the structure of possible tests with regard to the assembly of the technical system 3 with the group of the functional units 9, and to evaluate the influence of possible tests on the defect probabilities 15 of the functional unit 9. For this, for example, in an expert system collected information and rules can be used.

Furthermore, the processing unit 13 has available to it the possibility to evaluate (for example, again with the use of the expert system) the test suggestions 19, such that the test suggestion 19 that enables a quick and efficient identification of the defective functional unit 17 is implemented first. The implementation of the most advantageous test suggestion 19 as a second test of the technical system 3 can now be started automatically by the processing unit 13, or it can be implemented after asking a service technician.

In a second cycle of the automated processing, the processing unit 13 now makes available a second test result 21, in addition to the information from the analysis of the first test 1, as well as information about the functional units that were checked by the second test. The cycle of the automated processing aided by the implementation of further tests can be repeated until a defect probability 15 is over the limit defect probability limit, i.e. until the defective functional unit 17 is found.

Figure 2:
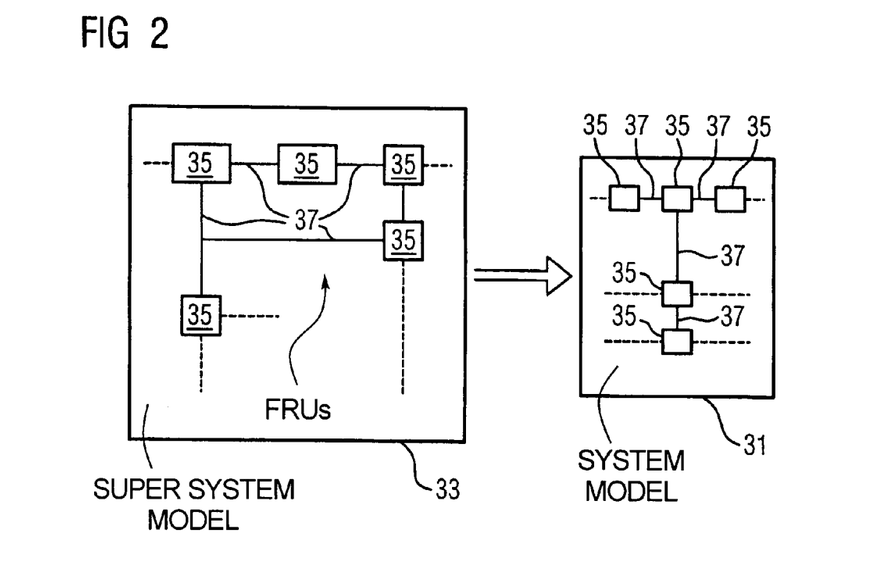
FIG. 2 is a schematic diagram to explain the configuration of the system model from the super system model.

The development of the system model 31 from the super system 33 that is configured on the technical system 3 is shown in a schematic diagram in FIG. 2. The super system model 33 specifies the structure of a system family, i.e. of a family of similar technical systems 3, with the aid of functional units 9. The functional units 9 are FRUs 35 or connection units 37 that connect the FRUs 35 with one another. Due to the configuration of the super system model 33, it is possible to project the structure of the technical system 3 in the system model 31. Configurations for other technical systems that likewise belong to the system family lead to corresponding system models. The system model 31 specifies the assembly (realized in the technical system 3) of the different FRUs 35 and its connection by means of the connection units 37. Such a representation of the technical system 3 enables it to bring tests (for example test 1 and 19) and functional units 9 (i.e. the FRUs 35 and the connection units 37) together in a logical interrelationship.

Figure 3:
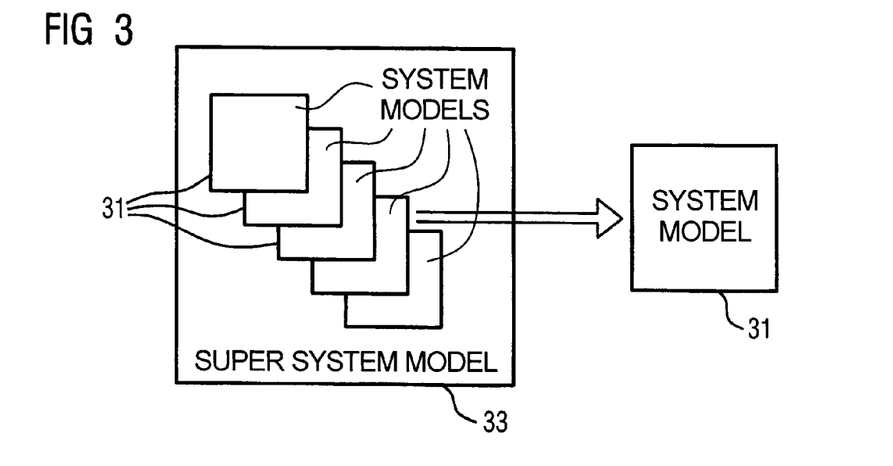
FIG. 3 illustrates an alternative assembly of the super system model.

An alternative assembly of the super system model 33 is shown in FIG. 3. The super system model 33 includes the system model 31 of all technical systems 3 that belong to the system family. In the configuration, the appropriate system model 31 is then selected from the super system model 33.

Figure 4:
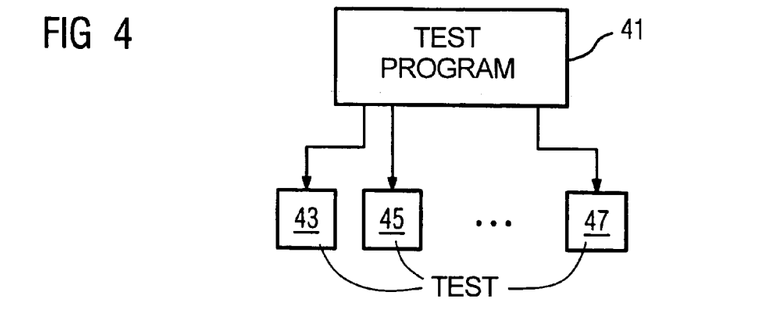
FIG. 4 shows the connection between a test program and the tests belonging to it.

In FIG. 4, the interrelationship is shown between a test program 41 and possible tests 43, 45, 57 that can be achieved by means of parameterization from the test program 41. The test program 41 allows, by selection of parameters, measurements to be implemented at the technical system 3 that is similar, i.e. that for example check a similar structure of functional units 9.

Figure 5:
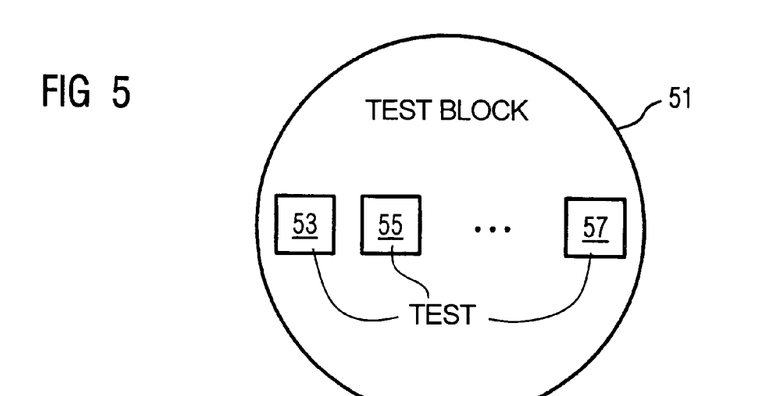
FIG. 5 shows the connection between a test block and the tests belonging to it.

FIG. 5 schematically shows the interrelationship between a test block 51 and some tests 53, 55, 57 belonging to it. The aggregation of different tests 53, 55, 57 in the test block 51 makes it possible for a sequence of tests to be executed with a single call. This reduces the number of possible tests at the technical system 3 to test blocks 51, i.e. groups of tests that are preferred tests with identical functions or tests that apply to the same functional units 9.

Figure 6:
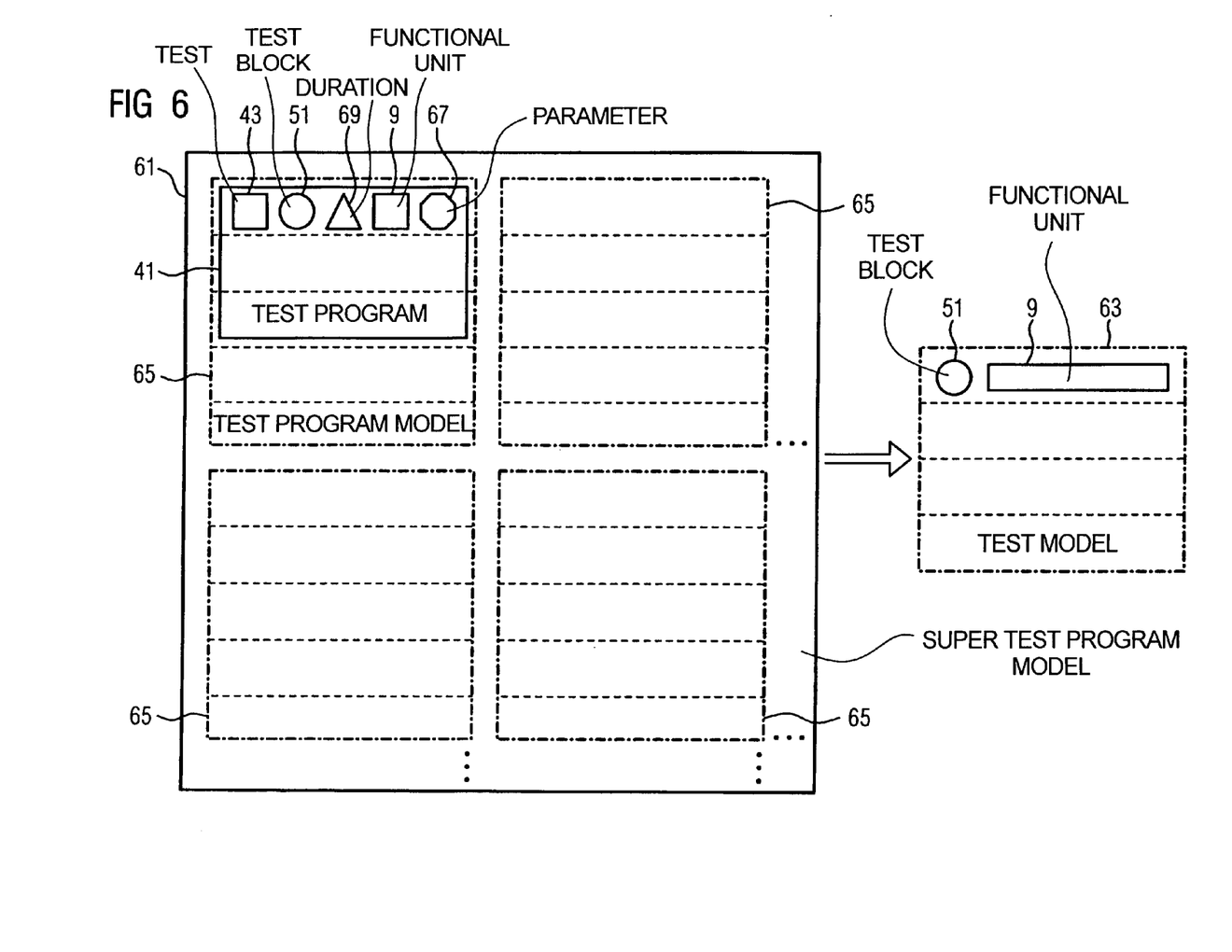
FIG. 6 is a schematic diagram to explain the configuration of the test model from the super test program model.

FIG. 6 shows, in a schematic representation, a super test program model 61 as well as a test model 63 generated from it. The super test program model 61 includes different test program models 65 that apply in turn to different technical systems 3. The assignment of information that is important for the processing of the tests to the individual tests is specified in the test program model. For example, it is recorded which parameter 67 is assigned to which test program 41 in order to generate the test 63, which functional units 9 are checked by the test 43, which duration 69 of the test 43 is called on, and to which test block 51 it is assigned. This information is stored for all tests and all test programs in the super test program model 61.

Furthermore, the super test program model 61 is structured such that all information that applies to a technical system 3 is compiled in a test program model 65. This has the advantage that the progressive development must only be carried out once for all technical systems in the super test program 61 calculation.

For the automated processing, it is advantageous to generate the test model 63 from the super test program 61, the test model 63 then containing only the key information about which functional units 9 are checked by which test block 51, as well as information that is necessary to determine a sequence of the test suggestions 19. For the case that the test blocks are executed, the connection of this information to the test blocks is crucial for the automatic processing. If individual tests are also executed, it is advantageous for the test model to include the key information with regard to the individual tests. This can lead to acceleration of the method in the automation of the error identification, since specific individual tests can be implemented and analyzed.

Figure 7:
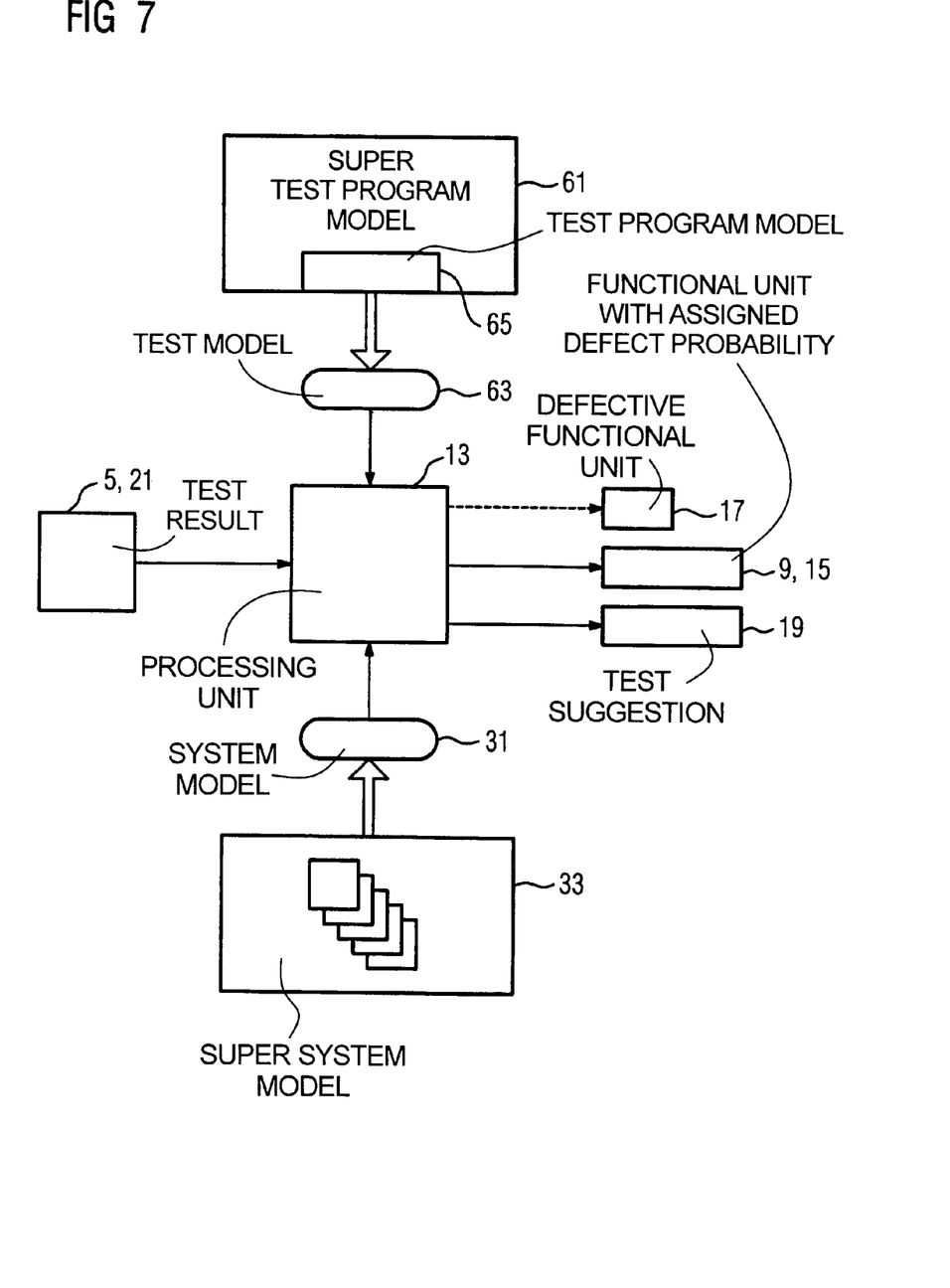
FIG. 7 is a diagram to explain the information flow in the automated processing of test results.

FIG. 7 shows a diagram to explain the information flow in the automated processing of test results. The processing unit 13 contains the information about the test results 5, 21 of implemented tests 1, 19. Furthermore, the processing unit 13 can access the test model 63 in which the information exists about which functional units 9 are affected by the implemented tests. For the analysis and for the suggestions of further tests, the processing unit 13 can also access the system model 31 that contains the information about the assembly of the technical system 3 as a configuration of functional units 9.

The processing unit 13 then provides information about the functional units 9 that can be defective, as well as their defect probabilities 15. Furthermore, the processing unit 13 provides a list of test suggestions 19 that are arranged according to their relevance for the identification of a defect in the technical system 3. After a successful, more precise rendering of the defect probabilities 15, the processing unit 13 can provide the information as to which of the functional units 9 is the defective functional unit 17.

In addition, the interrelationship of test model 63, test program model 65 and super test program 33 and the interrelationship of system model 31 and super system model 33 are indicated in the diagram.

Figures 8, 9:
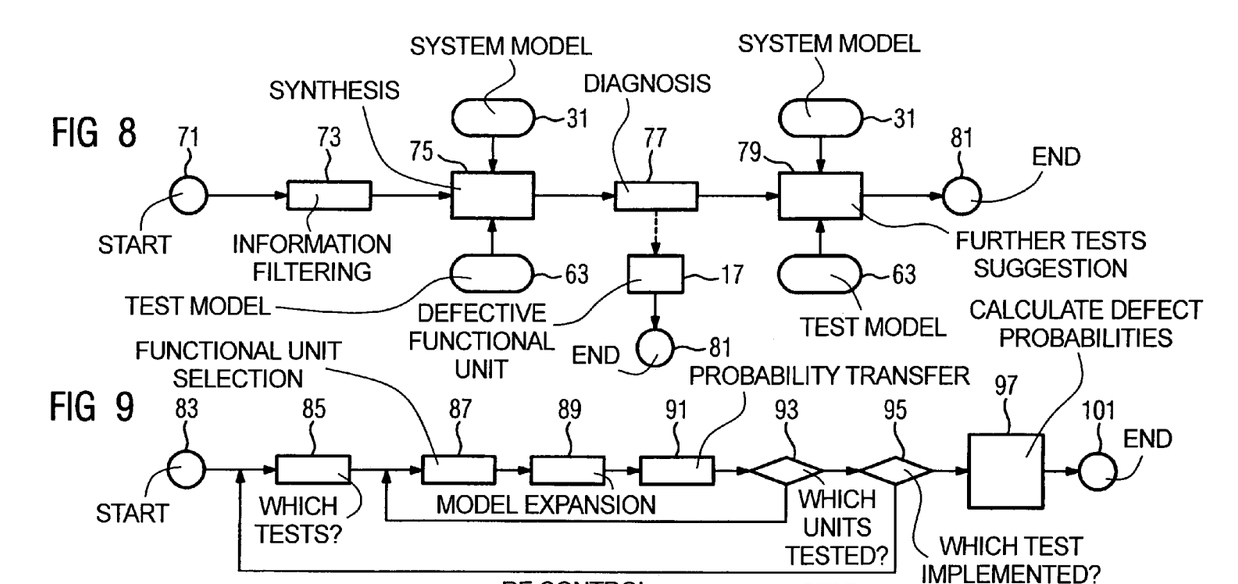
FIG. 8 is a flow diagram of the automated processing in accordance with the invention.
FIG. 9 is a flow diagram of a synthesis in the automated processing according to FIG. 8.

The procedure of the automated processing is shown in FIG. 8 in a flow diagram. After the start 71 of the processing, an information filtering is first implemented. If they are present, stored results of earlier tests are thereby filtered for useful information, and the current test result is delivered.

In a second step, the synthesis 75, the test result is analyzed with the use of information from the system model 31 and the test model 63. For example, it is checked which connection units (for example cables) or which exchangeable functional units (for example FRUs) participated in the test. Finally, the defect probabilities that arise from the current tests are combined via a mathematical model with signal processing that were determined using previous tests.

In a third step, the diagnosis 77, the result of the mathematical model is evaluated by, for example, comparing the defect probabilities to the defect probability limit. For this, the defect probabilities are arranged in a rough classification.

In the event that a defect probability lies above the defect probability limit, the defective functional unit would be successfully identified by the tests.

In the event that no clear result exists, in a fourth step—the suggesting 79 of further tests to render more precisely the defect probabilities are sought from the test model 63. For this, information is called from the system model 31. The determination of a new test can ensue using the exclusion principle, i.e. the test is implemented to minimize the group of the possible defective functional units. Alternatively, it is possible to modify the defect probabilities by means of tests of selected functional units coalescing a more meaningful specificity. For this, the suggestions are presented in an arrangement, for example, according to their complexity or according to their time requirement. If the implementation of tests ensues by means of test blocks, the automated processing is based on the test blocks.

In FIG. 9, the procedure of the synthesis 75 that is implemented in the automated processing according to FIG. 8 is explained in more detail. After the start 83 of the synthesis, a check 85 initially ensues in a first step as to which test was implemented. The test can be implemented in the course of a test block. Each of the functional units of the tests is analyzed in its own cycle.

In addition, in a second step 87 a first functional unit of the test is selected. In the third step 89, the mathematical model is expanded around this functional unit. In a fourth step 91 another conditional probability for this functional unit can be transferred to the mathematical model (for example, a high failure probability for a particularly sensitive functional unit). In the fifth step 93, it is checked whether still further functional units participated in the tests, and if they did, the steps 87 through 93 are repeated until all functional units of the test have been accounted for.

In the sixth step 95, it is checked which further tests were implemented, for example in the course of a test block. The steps 85 through 95 are likewise implemented for the corresponding functional units.

Finally, in the seventh and most important step 97 the defect probabilities of the appertaining functional units are calculated with the mathematical model. The end 101 of the flow diagram of the synthesis is then reached.

The invention also enables a fully automated defect identification. For example, if a service technician or an operator of a technical system (for example a magnetic resonance tomography apparatus) recognizes a defect of the system due to inadequate results or an incorrect function, he or she can initiate, for example, the following sequence of the defect identification by means of a test software.

The test software then executes a first test that, for example, gives no indication of a defective functional unit. The corresponding first test result is automatically analyzed, and all functional units that were not checked by the first test are categorized as potentially defective and form a group of functional units to be further examined.

Subsequently, a second test is implemented by the test software that, for example, again indicates no defective functional unit. An automated reprocessing further narrows the group and suggests a third test. This third test indicates first that one of the functional units checked by the third test is defective. The automated processing of the third test results now clearly narrows the group. Further tests that render more precisely the apportioned defect probabilities are implemented until one defective functional unit is clearly identified. The cycle of the automated processing ensues according to the method of the invention, for example, the analysis of test results, the defect probability assignment, the suggestion and implementation of further tests.

An advantage of the fully automated defect identification is a shortening of the time required to identify an error, due to the automatic implementation of many tests that require little time consuming interactions with service technicians.

In a less automated version of the test software, (for example) a service technician decides himself or herself which test or test block is implemented at the beginning to isolate the defective functional unit. According to an inventive processing of the test results, he or she selects from the suggested tests the next one, and can this bring his or her personal expertise to the defect identification.

Figure 10:
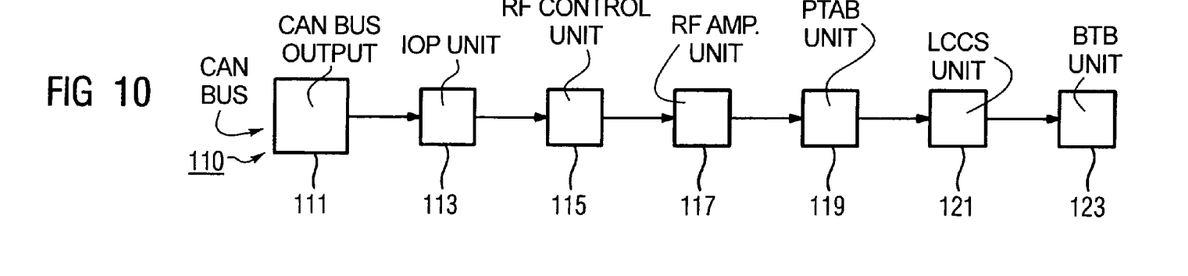
FIG. 10 is a first example of the process of the identification of a defective functional unit in accordance with the invention in a communication chain that is used in a magnetic resonance tomography device.

FIG. 10 shows a first example for the procedure of the identification of a defective unit in a communication chain that is used in an magnetic resonance system. FIG. 10 shows the assembly of a CAN bus 110 (Control Area Network) that, originating from the processor, includes various FRUs that are connected with one another via cables. In the example, a chain exists (that begins at the CAN bus output 111 of the processor) from the following FRUs: an IOP unit 113 (Input/Output and power board), a radio-frequency control unit 115, a radio-frequency amplification unit 117, a PTAB unit 119 (patient table), an LCCS unit 121 (Local Coil Channel Selector) and a BTB unit 123 (Body Tune Box).

The FRUs are connected via cables that leads from the output of the one unit into the input of the next. When a cable is defective, it is not possible to communicate with the subsequent FRUs. It could occur, however, that the communication with a specific FRU is not possible, for example with the LCCS unit 121, but in spite of that a communication with the subsequent units is possible, in this case with the BTB unit. It can be determined from this that the cables of the CAN bus 110 are intact, and that only the LCCS unit 121 is defective and thus should be replaced.

The specification of the CAN bus 110, in which sequence the FRUs are connected with one another, would be comprised in the system model. A test block would compile the tests that respectively check the communication with an FRU. It is recorded in the test model which cables and FRUs are traversed by which test in order to be able to communicate with a specific FRU. With the use of the test model and the system model, the defect can then be automatically identified.

For example, a communication test with the LCCS unit 121 was not successfully executed. Indeed, still no communication test was executed with the BTB unit 123. This test is suggested in the method in order to differentiate between a defect of the cable between the PTAB unit 119 and the LCCS unit 121 or a defect of the LCCS unit 121.

Figure 11:
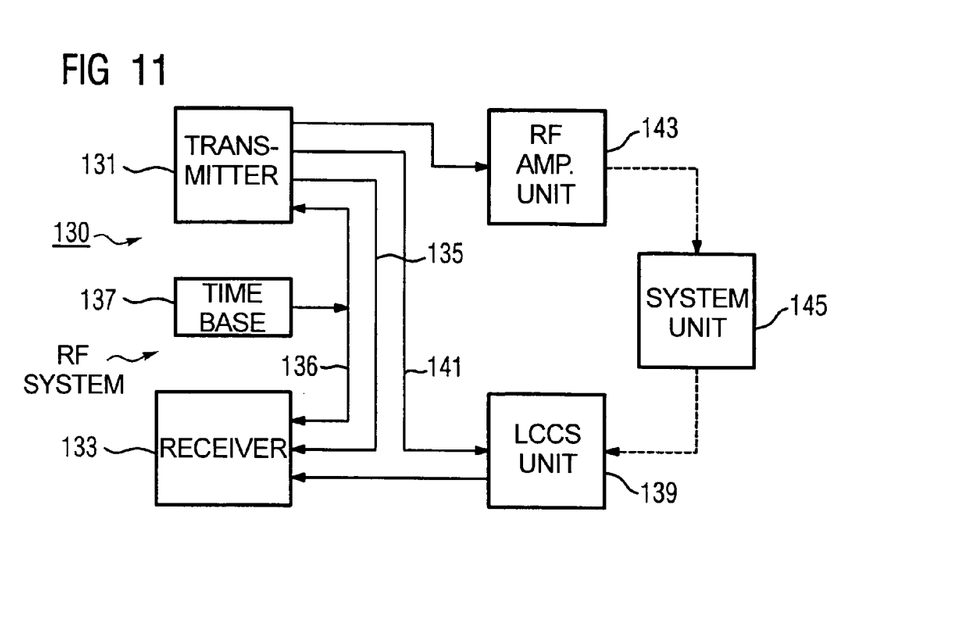
FIG. 11 is a second example of the process of the identification of a defective unit in accordance with the invention in a radio-frequency system of a magnetic resonance tomography device.

FIG. 11 shows a second example for the execution of the identification of a defective unit in a radio-frequency system 130 of a magnetic resonance tomography device. The radio-frequency system 130 is comprised of a plurality of FRUs that are networked with one another via cables. The radio-frequency system 130 includes, for example, a transmitter 131 that is connected with a receiver 133 via a loop cable 135. The receiver 133 and the transmitter 131 are connected via the time base cable 136 with a time base 137 that serves for synchronization. The transmitter 131 is furthermore connected with an LCCS unit 139 via a TTX cable 141 (Tuned Transmitter Output). The LCCS unit 139 is in turn connected with the receiver 133. The transmitter 131 is additionally connected with a radio-frequency amplifier unit 143. Other system units 145 of the magnetic resonance tomography device can likewise be connected with the radio-frequency amplifier unit 143 and the LCCS unit 139.

In such complex systems, it is generally impossible to find the defect with a single test. A very simple loop test in this system, that checks a number of FRUs and cables, carries a measurement from the transmitter 131 to the receiver 133. It additionally requires the time base 137 and the time base cable 136. When this test indicates an error, the transmitter 131, the loop cable 135, the receiver 133, the time base 137, and the time base cable 136 can be defective.

In order to reduce the number of participating FRUs, a second loop test can be implemented that leads from the transmitter 131 over the TTX cable 141 to the LCCS unit 139 and back to the receiver 133. In this case, the loop cable 135 is bypassed such that, in the event that no error ensues in this test, a defect of the loop cable 135 is concluded. If the second loop test is also erroneous, the transmitter 131, the receiver 133, the time base 137, and the time base cable 136 can be defective, and further tests must be implemented. In order to eliminate a double defect of TTX cable 141 and loop cable 135, further tests are likewise necessary.

Figure 12:
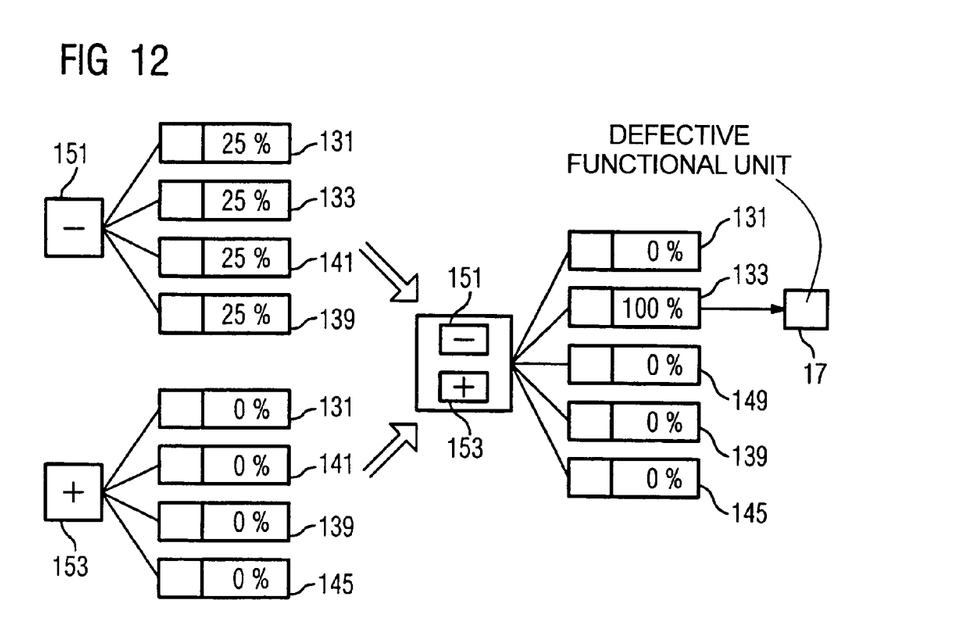
FIG. 12 is an example of the procedure in the combination of defect probabilities that are based on two tests.

FIG. 12 shows an example for proceeding in the combination of defect probabilities that are based on two tests on the radio-frequency system 130. A first tests 151 exhibits a defect that is present in one of the checked components (transmitter 131, TTX cable 141, LCCS unit 139, and receiver 133. Correspondingly, the defect probability for each of the components is 25 percent. If a second supplementary test 153 is successfully implemented without an error message, none of the checked components (transmitter 131, TTX cable 141, LCCS unit 130, and system unit 145) is defective, thus the receiver 133 is identified as the defective functional unit in the combined processing of the results of the test 151.

In the assignment of defect probabilities based on a number of tests, it is advantageous to provide the defect probability dependent on the test, or also on the tested functional unit with a weighting, so that, for example particularly susceptible functional units have a higher defect probability. Furthermore, it can be advantageous, when a conclusion must be reached about the defect probabilities, for the defect probabilities to be normalized to each other, to include the mathematical model with the normalized defect probabilities, and for making the decision, to arrange the defect probabilities in rough classes. An example for a mathematical model that can be applied for calculations of signal processing is the Bayesian network model.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for assisting identification of a defective functional unit in a technical system comprising a plurality of functional units, said method comprising the steps of:
   subjecting said technical system to a test to obtain a first test result relating to operation of said technical system; and
   using a test model in which information is compiled with respect to which of said functional units were tested in said test, and using a system model in which information is compiled regarding assembly of said functional units in said technical system, automatically processing said test result by analyzing said test result to initially determine a group of said functional units which could be defective based on said test result, thereby obtaining an analysis result, and thereafter using said analysis result to assign respective defect probabilities to each of the functional units in said group.

2. A method as claimed in claim 1 comprising comparing the respective defect probabilities of said functional units in said group to a defect probability limit, and designating any of said functional units in said group as being defective that has a defect probability assigned thereto that exceeds said probability limit.

3. A method as claimed in claim 2 wherein said test is a first test, and comprising the additional step of, if none of said respective defect probabilities assigned to said functional units in said group exceeds said defect probability limit, designating a second test which more precisely refines the respective defect probabilities of the functional units in said group.

4. A method as claimed in claim 3 wherein the step of designating a second test comprises designating a plurality of second test suggestions; and
   automatically presenting said plurality of second test suggestions according to at least one criterion that characterizes a relevancy of the respective test suggestions for identifying a defective functional unit in said group.

5. A method as claimed in claim 4 wherein said plurality of test suggestions includes a most relevant test suggestion, and automatically implementing said most relevant test suggestion as said second test.

6. A method as claimed in claim 3 comprising the additional steps of:
   (a) implementing said second test on said technical system to obtain a second test result;
   (b) using said first test result, said information from said test model as to which of said functional units was tested, said information from said system model as to said assembly of said function units in said technical system, analyzing said second test result to more precisely refine the respective defect probabilities of the functional units in said group, thereby obtaining respective, more precise defect probabilities;
   (c) comparing said respective, more precise defect probabilities to said defect probability limit and designating any of said functional units in said group having a more precise defect probability that exceeds said defect probability limit as defective; and
   (d) if none of said respective, more precise defect probabilities exceeds said defect probability limit, designating a further test of said functional units in said group to more precisely refine the respective more precisely refined defect probabilities obtained in step (b), and automatically implementing said further test.

7. A method as claimed in claim 6 comprising repeating step (c) until at least one of said respective defect probabilities is more precisely refined so as to exceed said defect probability limit.

8. A method as claimed in claim 6 wherein step (c) comprises designating a plurality of further tests for more precisely refining the respective more precisely defined defect probabilities obtained in step (b), automatically presenting said plurality of further tests according to at least one criterion representing a relevancy of the respective further tests for identification of a defective functional unit, and automatically implementing one of said plurality of further tests that has a highest relevancy for identification of a defective functional unit.

9. A method as claimed in claim 1 wherein each of said functional units in said group has a pre-test defect probability existing before said first test, and wherein the step of assigning the respective defect probabilities to said functional units in said group comprises, for each of said functional units in said group, formulating a mathematical combination of said pre-test defect probability and a defect probability based on said test.

10. A method as claimed in claim 9 comprising formulating said mathematical combination using a Bayesian network model.

11. A method as claimed in claim 1 comprising employing exchangeable structural units as said plurality of functional units in said technical system.

12. A method as claimed in claim 1 comprising employing, as one of said plurality of functional units in said technical system, a connection between other functional units in said technical system.

13. A method as claimed in claim 12 comprising selecting said connection from a group consisting of electrical signal transmitters and optical signal transmitters.

14. A method as claimed in claim 12 comprising employing an energy supply connection as said connection.

15. A method as claimed in claim 1 comprising testing individual functioning of at least one of said plurality of functional units in said test.

16. A method as claimed in claim 1 comprising testing multiple functional units, within said plurality of functional units, along a test signal path as said test.

17. A method as claimed in claim 1 comprising selecting said test from among a plurality of different tests in a computerized test program by parameterization.

18. A method as claimed in claim 17 wherein the step of testing said technical system comprises implementing a plurality of tests, from among said different tests in said test program, having a common functional form, as a test block, and calling said test with a single call command within said test program.

19. A method as claimed in claim 18 comprising, using said test model, compiling information as to which of said functional units was tested by said test block.

20. A method as claimed in claim 19 comprising generating said test model by configuring a test program model of said technical system comprising a specification of said test block.

21. A method as claimed in claim 20 comprising specifying said test block by at least one criterion selected from the group consisting of purpose, significant parameters and respective ones of said functional units.

22. A method as claimed in claim 1 comprising generating said test model based on said plurality of functional units.

23. A method as claimed in claim 22 comprising generating said test model by configuring a super test model of said technical system from a plurality of further technical systems related to said technical system to be tested.

* * * * *